(12) United States Patent
Lee et al.

(10) Patent No.: US 8,003,429 B2
(45) Date of Patent: Aug. 23, 2011

(54) METHOD OF FABRICATING IMAGE SENSOR

(75) Inventors: Jeong-Ho Lee, Seoul (KR); Sang-Il Jung, Seoul (KR); Young-Hoon Park, Gyeonggi-do (KR); Jun-Seok Yang, Gyeonggi-do (KR); An-Chul Shin, Gyeonggi-do (KR); Min-Young Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 248 days.

(21) Appl. No.: 12/313,067

(22) Filed: Nov. 17, 2008

(65) Prior Publication Data

US 2009/0130792 A1     May 21, 2009

(30) Foreign Application Priority Data

Nov. 19, 2007   (KR) .................. 10-2007-0118136

(51) Int. Cl.
*H01L 31/18* (2006.01)

(52) U.S. Cl. ............ 438/70; 438/73; 257/291; 257/292; 257/294; 257/431; 257/432; 257/443; 257/461; 257/462; 257/E31.054; 257/E31.093

(58) Field of Classification Search ............... 438/57, 438/69, 70, 73; 257/290, 291, 292, 294, 257/428, 431, 432, 443, 461, 462, E21.347, 257/E31.054, E31.093
See application file for complete search history.

(56) References Cited

U.S. PATENT DOCUMENTS

| | | | |
|---|---|---|---|
| 6,207,531 B1 * | 3/2001 | Pen-Liang | 438/424 |
| 6,627,560 B1 * | 9/2003 | Miyano et al. | 438/788 |
| 7,267,848 B2 * | 9/2007 | Miyano et al. | 427/595 |
| 2003/0138562 A1 * | 7/2003 | Subramony et al. | 427/255.28 |
| 2006/0226396 A1 * | 10/2006 | Majumdar et al. | 252/500 |
| 2007/0059901 A1 * | 3/2007 | Majumdar et al. | 438/455 |
| 2007/0153337 A1 | 7/2007 | Kim | |
| 2007/0284687 A1 * | 12/2007 | Rantala | 257/432 |
| 2008/0007518 A1 * | 1/2008 | Majumdar et al. | 345/156 |
| 2009/0050855 A1 * | 2/2009 | Majumdar et al. | 252/500 |
| 2009/0130792 A1 * | 5/2009 | Lee et al. | 438/70 |
| 2009/0137111 A1 * | 5/2009 | Lee et al. | 438/618 |
| 2010/0118243 A1 * | 5/2010 | Majumdar et al. | 349/122 |

FOREIGN PATENT DOCUMENTS

| | | | |
|---|---|---|---|
| JP | 56-32304 | * | 4/1981 |
| JP | 2000-114504 | | 4/2000 |
| KR | 10-2007-0071045 A | | 7/2007 |
| KR | 10-0755666 | | 8/2007 |

* cited by examiner

*Primary Examiner* — Mary Wilczewski
(74) *Attorney, Agent, or Firm* — Mills & Onello, LLP

(57) ABSTRACT

A method of fabricating an image sensor includes forming a photoelectric transformation device on a substrate and forming a dielectric layer structure on the substrate. The dielectric layer structure includes multi-layer interlayer dielectric layers and multi-layer metal interconnections which are located between the multi-layer interlayer dielectric layers. A cavity which penetrates the multi-layer interlayer dielectric layers on the photoelectric transformation device is formed. A heat treatment is performed on the substrate on which the cavity is formed.

13 Claims, 14 Drawing Sheets

METHOD OF FABRICATING IMAGE SENSOR

CROSS REFERENCE TO RELATED APPLICATION

This application claims priority from Korean Patent Application No. 10-2007-0118136 filed on Nov. 19, 2007, in the Korean Intellectual Property Office, the contents of which are incorporated herein by reference in their entirety.

BACKGROUND OF THE INVENTION

1. Field of the Invention

The present invention relates to a method of fabricating an image sensor.

2. Description of the Related Art

An image sensor transforms optical images into electrical signals. Recent advances in computer and communication industries have led to strong demands for high performance image sensors in various consumer electronic devices including digital cameras, camcorders, PCS (Personal Communication System), game devices, security cameras medical microcameras, and the like.

Specially, a MOS image sensor can be readily driven and implemented using various scanning methods. Also, the size of a product can be minimized since digital signal processing circuits can be integrated into a single chip, and the fabrication cost can be reduced as MOS process technology can be used. Also, because of low power consumption, MOS image sensors can be readily to battery-powered products. Therefore, with the advances in implementation of high resolution MOS image sensors, the use of MOS image sensors has rapidly increased.

SUMMARY OF THE INVENTION

A MOS image sensor includes a photoelectric transformation device which absorbs incident light and accumulates corresponding charge, and multi-layer metal interconnections to output the charge in the photoelectric transformation device. For the metal interconnections, aluminum or copper interconnections can be used. As MOS image sensors are becoming miniaturized, the copper interconnection is being more widely used since the copper interconnection has lower specific resistance and can be formed in narrow patterns.

Also, on the photoelectric transformation device of a MOS image sensor, multi-layer interlayer dielectric layers to insulate multi-layer of metal interconnections, etch stop layer used for forming copper interconnections, and diffusion barrier layers to prevent diffusion of copper interconnections are formed. Here, among the layers formed on the photoelectric transformation device there can be layers that have a low light penetration ratio. For example, a silicon nitride layer used for an etch stop layer and/or diffusion barrier layer has a low light penetration ratio. In this case, the photosensitivity of an image sensor can be reduced since the incident light cannot easily reach the photoelectric transformation device.

Therefore, on the photoelectric transformation device a cavity that penetrates multi-layer interlayer dielectric layers, an etch stop layer, and a diffusion barrier layer can be formed to increase photosensitivity. The cavity can be formed using a plasma etch process, and such a process can cause damage to a photoelectric transformation device which can increase a dark level of output signals.

The present invention provides a method of fabricating an image sensor nonvolatile memory device to reduce the dark level of an output signal.

According to an aspect of the present invention, there is provided a method of fabricating an image sensor including forming a photoelectric transformation device on a substrate and forming a dielectric layer structure on the substrate on which the photoelectric transformation device is formed. The dielectric layer structure includes multi-layer interlayer dielectric layers and multi-layer metal interconnections which are located between the multi-layer interlayer dielectric layers. A cavity is formed, the cavity penetrating the multi-layer interlayer dielectric layers on the photoelectric transformation device. A heat treatment is performed on the substrate on which the cavity is formed.

According to another aspect of the present invention, there is provided method of fabricating an image sensor including forming a photoelectric transformation device on a substrate and forming a dielectric layer structure on the substrate on which the photoelectric transformation device is formed. The dielectric layer structure includes multi-layer interlayer dielectric layers and multi-layer metal interconnections which are located between the multi-layer interlayer dielectric layers. A cavity is formed, the cavity penetrating the multi-layer interlayer dielectric layers on the photoelectric transformation device. A UV treatment is performed on the substrate on which the cavity is formed.

According to another aspect of the present invention, there is provided method of fabricating an image sensor including forming a photoelectric transformation device on a substrate and forming a dielectric layer structure on the substrate on which the photoelectric transformation device is formed. The dielectric layer structure includes multi-layer interlayer dielectric layers and multi-layer copper interconnections. A cavity is formed by a plasma etching process, the cavity penetrating the multi-layer interlayer dielectric layers on the photoelectric transformation device. A heat treatment is performed on the substrate on which the cavity is formed. A UV treatment is performed on the substrate on which the heat treatment is performed. The cavity is filled with a light penetration material. A color filter and a microlens are formed on the light penetration material.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

Figure 1:
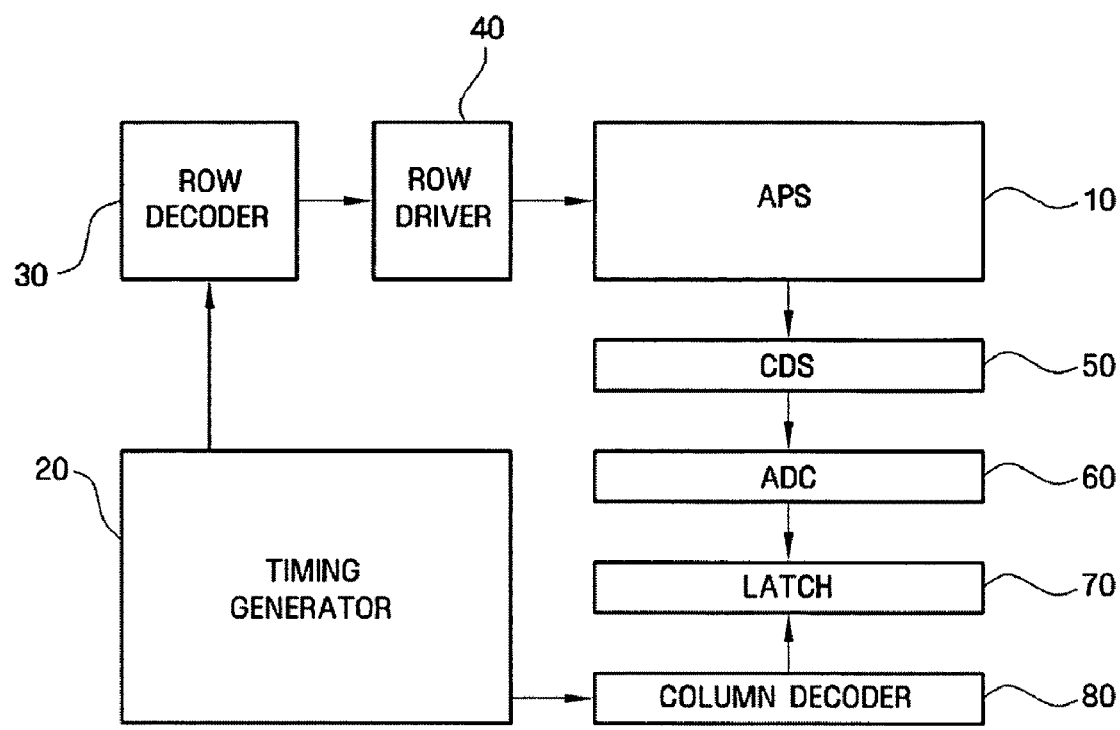
FIG. 1 is a block diagram illustrating an image sensor according to exemplary embodiments of the present invention.

The present invention will now be described more fully with reference to the accompanying drawings, in which exemplary embodiments of the invention are shown. It should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It should be understood that, although the terms first, second, and others may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It should be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having the meaning that is consistent with their meaning in the context of the relevant art and will not be interpreted in an idealized or overly formal sense unless expressly so defined herein.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can, therefore, encompass both an orientation of above and below.

In the embodiments of the present invention, an image sensor is a complementary metal oxide semiconductor (CMOS) image sensor. However, the present invention may be applied not only to an image sensor obtained by CMOS processes, which involve both N-channel metal oxide semiconductor (NMOS) and P-channel metal oxide semiconductor (PMOS) processes, but also to an image sensor obtained by NMOS processes and an image sensor obtained by PMOS processes.

FIG. 1 is a block diagram illustrating an image sensor according to exemplary embodiments of the present invention.

Referring to FIG. 1, an image sensor according to exemplary embodiments of the present invention includes an active pixel sensor APS array 10 which includes two-dimensional arrays of pixels having photoelectric transformation devices, a timing generator 20, a row decoder 30, a row driver 40, a Correlated Double Sampler CDS 50, an Analog-to-Digital Converter ADC 60, a latch unit 70, and a column decoder 80.

The APS array 10 includes unit pixels arranged in two dimensions. The unit pixels transform photonic images into electrical signals. The APS array 10 is driven by multiple driving signals from the row driver 40 including a row selection signal, a reset signal, and a charge transmission signal. Also, the electrically transformed output signals are delivered to the correlated double sampler 50 through vertical signal lines.

The timing generator 20 provides the row decoder 30 and the column decoder 80 with timing and control signals.

According to the decoding results from the row decoder 30, the row driver 40 provides the APS array 10 with multiple driving signals to drive the unit pixels. In general, in a case in which the unit pixels arranged in a matrix fashion, the driving signals are provided to each row.

The correlated double sampler 50 receives the output signals generated by the APS array 10 through vertical signal lines, and performs hold and sampling operations. In more detail, the correlated double sampler 50 double-samples a certain noise level and the signal level generated by the APS array, and outputs a difference level between the noise level and the signal level.

The ADC 60 outputs digital signals by converting analog signals of the difference level to digital signals.

The latch unit 70 latches the digital signals, and the latched signals are sequentially sent to an image signal processor (not shown) according to the decoding results from the column decoder 80.

Figure 2:
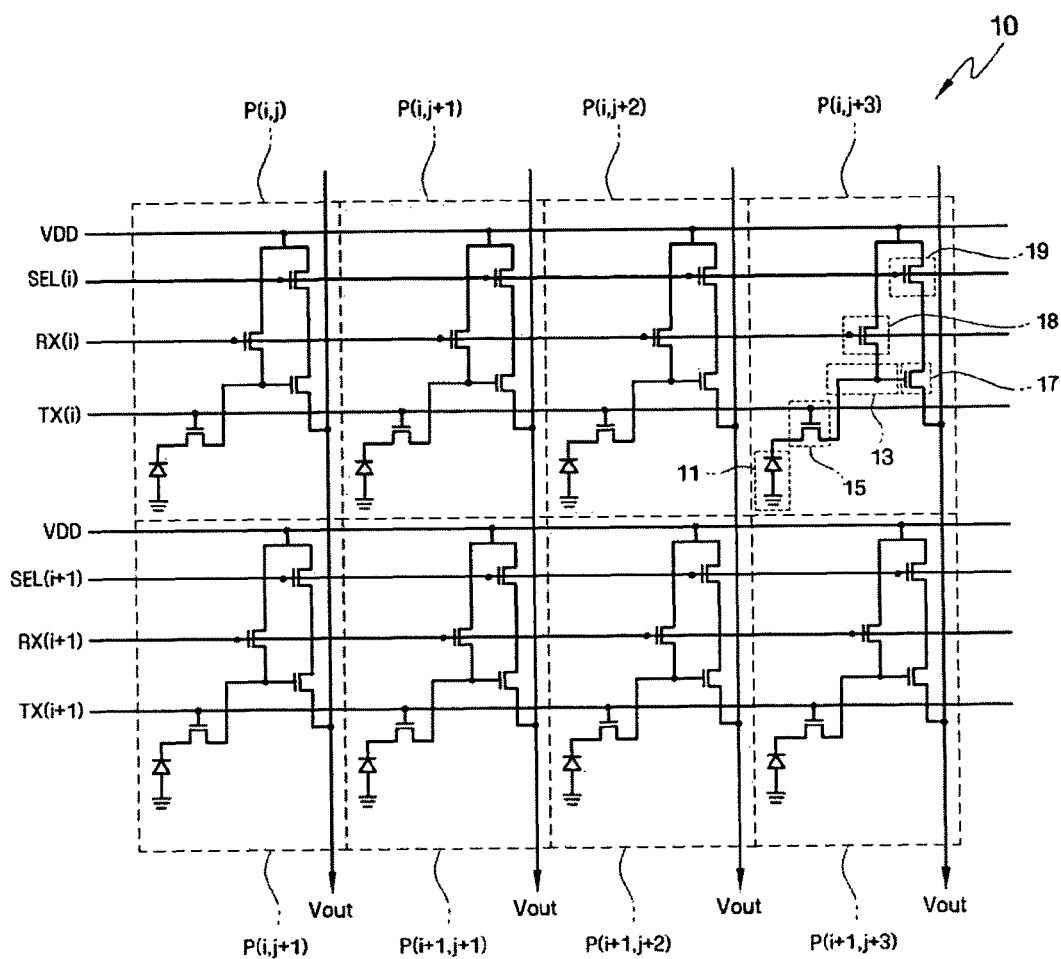
FIG. 2 is an equivalent circuit diagram corresponding to the APS array in FIG. 1.

FIG. 2 is an equivalent circuit diagram corresponding to the APS array 10 in FIG. 1.

Referring to FIG. 2, pixels are arranged in a matrix fashion to form the APS array 10. Each pixel P includes a photoelectric transformation device 11, a floating diffusion region 13, a charge transmission device 15, a drive device 17, a reset device 18, and a selection device 19. The functionality of these devices is described using an ith row pixel P(i, j), P(i, j+1), P(i, j+2), P(i, j+3), ... as an example.

The photoelectric transformation device 11 absorbs incident light and accumulates electric charges corresponding to the amount of incident light. The photoelectric transformation device 11 can include a photo diode, a photo transistor, a photo gate, a pinned photo diode, and combinations of these devices. In the drawing, a photo diode is shown.

Each photoelectric transformation device 11 is coupled with the charge transmission device 15 which transmits the accumulated charges to the floating diffusion region 13. The floating diffusion region FD 13 is a region that transforms charge into voltages, and since it has a parasitic capacitance, the charge is cumulatively stored.

The drive device 17, exemplified as a source follower amplifier, amplifies the changes of electrical potential in the floating diffusion region 13, which receives charges accumulated in each of the photoelectric transformation devices 11 and outputs to an output line Vout.

The reset device 18 periodically resets the floating diffusion region 13. The reset device 18 can include one MOS transistor driven by a bias provided by a reset line RX(i) to apply a bias (for example, a reset signal). When the reset device 18 is turned on by the bias provided by the reset line RX(i), the electrical potential applied to a drain of the reset device 18, for example, source voltage VDD, is delivered to the floating diffusion region 13.

The selection device 19 selects the pixel P to be read in each row. The selection device 19 can be comprised of one MOS transistor driven by a bias provided by a row selection line SEL(i) to apply a bias (for example, row selection signal). When the selection device 19 is turned on by the bias provided by the row selection line SEL(i), the electrical potential applied to a drain of the selection device 19, for example source voltage VDD, is delivered to a drain of the drive device 17.

The transmission line TX(i) to apply a bias to the charge transmission device 15, the reset line RX(i) to apply a bias to the reset device 18, and the row selection line SEL(i) to apply a bias to the reset device 18 can be extended and arranged in parallel to each other in the row direction.

Figure 3:
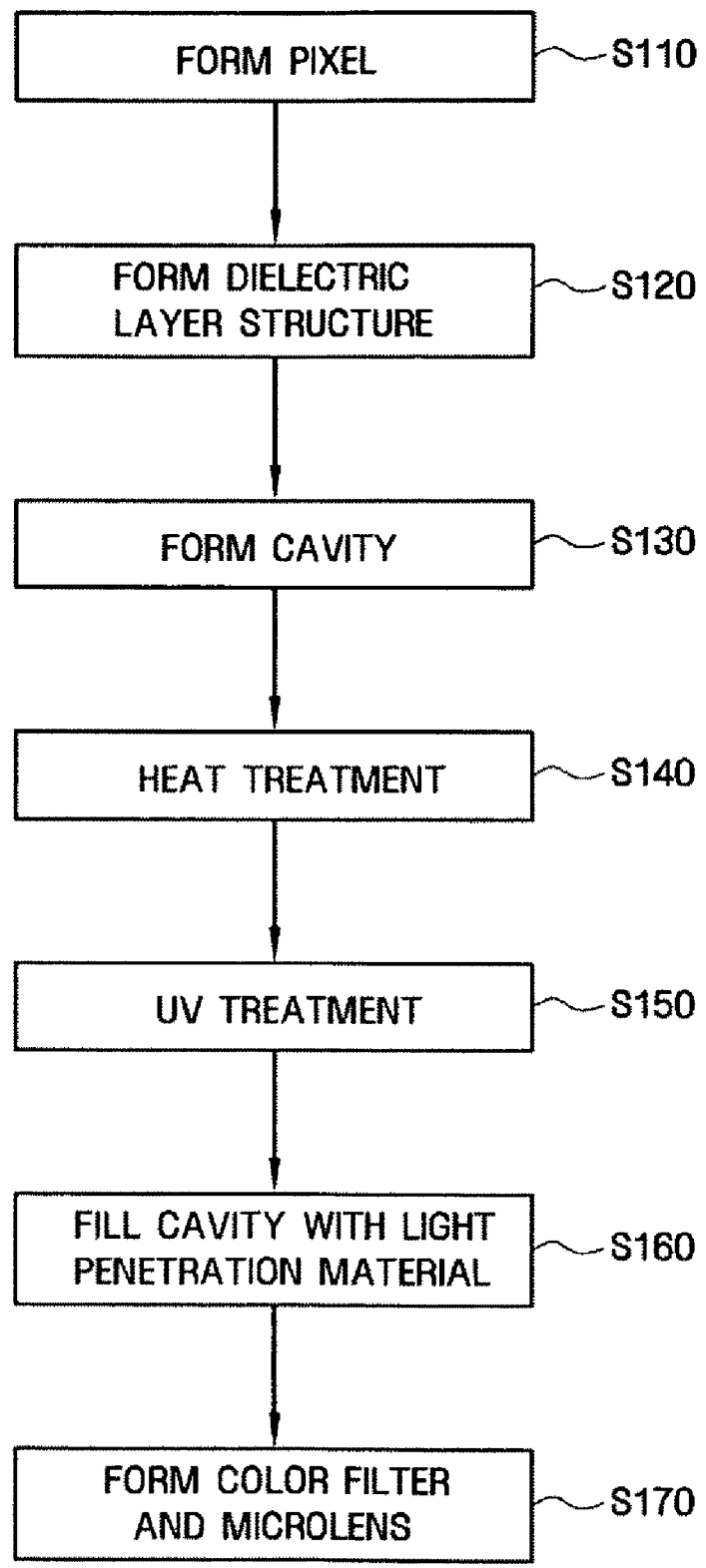
FIG. 3 is a flow chart illustrating a method of fabricating an image sensor according to a first exemplary embodiment of the present invention.

FIG. 3 is a flow chart illustrating a method of fabricating an image sensor according to the first exemplary embodiment of the present invention. FIGS. 4A through 4F are intermediate step sectional views illustrating the method of manufacturing an image sensor in FIG. 3. FIGS. 4A through 4F mainly illustrate a photoelectric transformation device and surrounding devices.

Figure 4A:
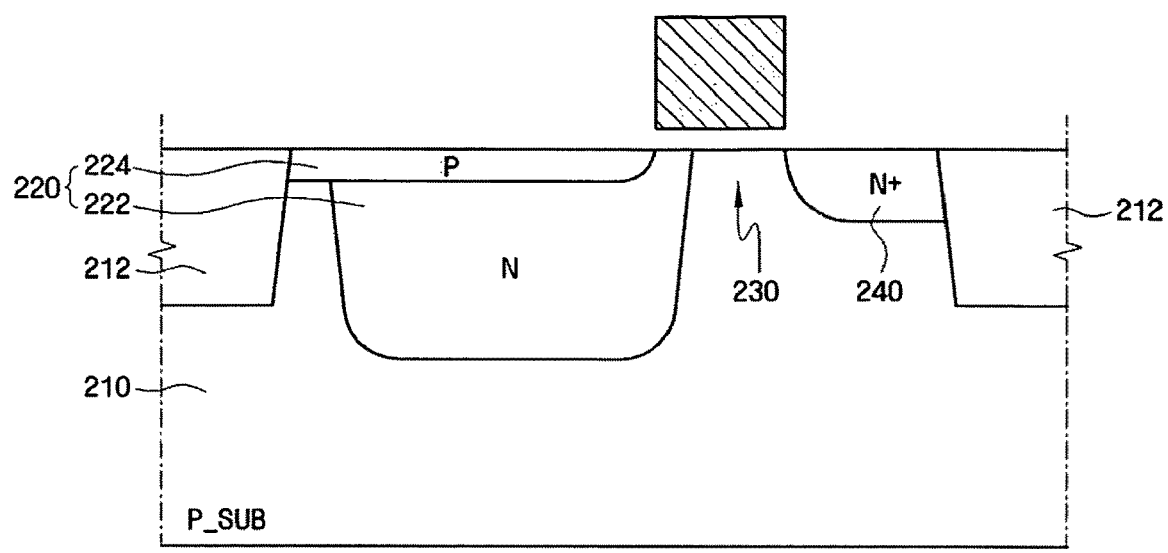
FIGS. 4A through 4F are schematic sectional views illustrating steps in a method of fabricating the image sensor in FIG. 3.

Referring to FIGS. 3 and 4A, multiple pixels are formed in a substrate 210 (step S110).

Specifically, an active region is defined by forming a device isolation region 212 such as by STI (Shallow Trench Isolation) or DTI (Deep Trench Isolation) on the substrate 210. The substrate 210 can be a first conductivity type (for example, P-type), and although not shown in the drawings, an epitaxial layer of the first conductivity type can be formed on the substrate 210.

Next, a photoelectric transformation device 220, a floating diffusion region 240, and multiple transistors are formed on the substrate 210. Here, the multiple transistors can include a charge transmission device 230, a drive device (not shown), a reset device (not shown), and a selection device (not shown). In FIG. 4A, a pinned photodiode is illustrated as an example of the photoelectric transformation device 220. The photoelectric transformation device 220 can be comprised of a second conductivity type (for example, N-type) impurity region 222 and a first conductivity type (for example, P-type) impurity region 224.

Figure 4B:
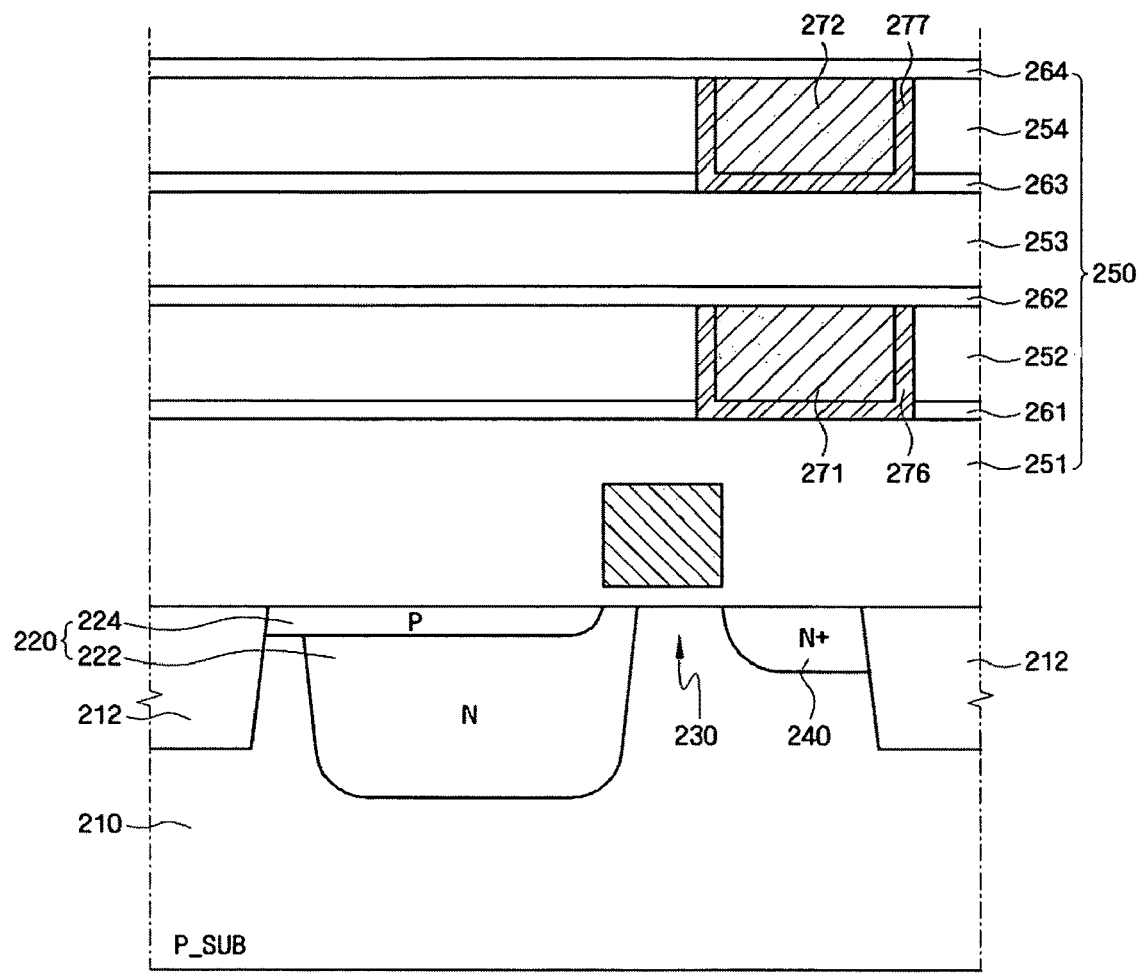

Referring to FIGS. 3 and 4B, a dielectric layer structure 250 is formed on the substrate 210 where multiple pixels are formed (step S120).

Here, the dielectric layer structure 250 can include multi-layer interlayer dielectric layers 251, 252, 253, 254, multi-layer diffusion barrier layer 261, 262, 263, 264, and multi-layer metal interconnections 271, 272. In FIG. 4B, although copper interconnection is used as an example of the metal interconnections 271, 272, it is not limited to the copper interconnections.

The diffusion barrier layers 261, 262, 263, 264 are used to prevent diffusion of copper atoms of the metal interconnections 271, 272. Also, the diffusion barrier layers 261, 262, 263, 264 can serve as an etch stop layer when forming the metal interconnections 271, 272, which are, in one embodiment, copper wires. It is desirable to have different etch ratios for the diffusion barrier layers 261, 262, 263, 264 and the interlayer dielectric layers 251, 252, 253, 254. Thus, silicon oxide layers can be used as the interlayer dielectric layers 251, 252, 253, 254, and silicon nitride layers can be used as the diffusion barrier layers 261, 262, 263, 264.

Also, barrier metal layers 276, 277 are formed in the surrounding area of the metal interconnections 271, 272. The barrier metal layers 276, 277 prevent copper atoms from diffusing to the interlayer dielectric layers 251, 252, 253, 254. The barrier metal layers 276, 277 can be formed of a tantalum (Ta) layer, tantalum nitride (TaN) layer, or a double layer formed by depositing a tantalum nitride layer on a tantalum layer.

In the case in which an aluminum interconnection or a tungsten interconnection is used as as the metal interconnections 271, 272, the barrier metal layers 276, 277 can be omitted.

Figure 4C:
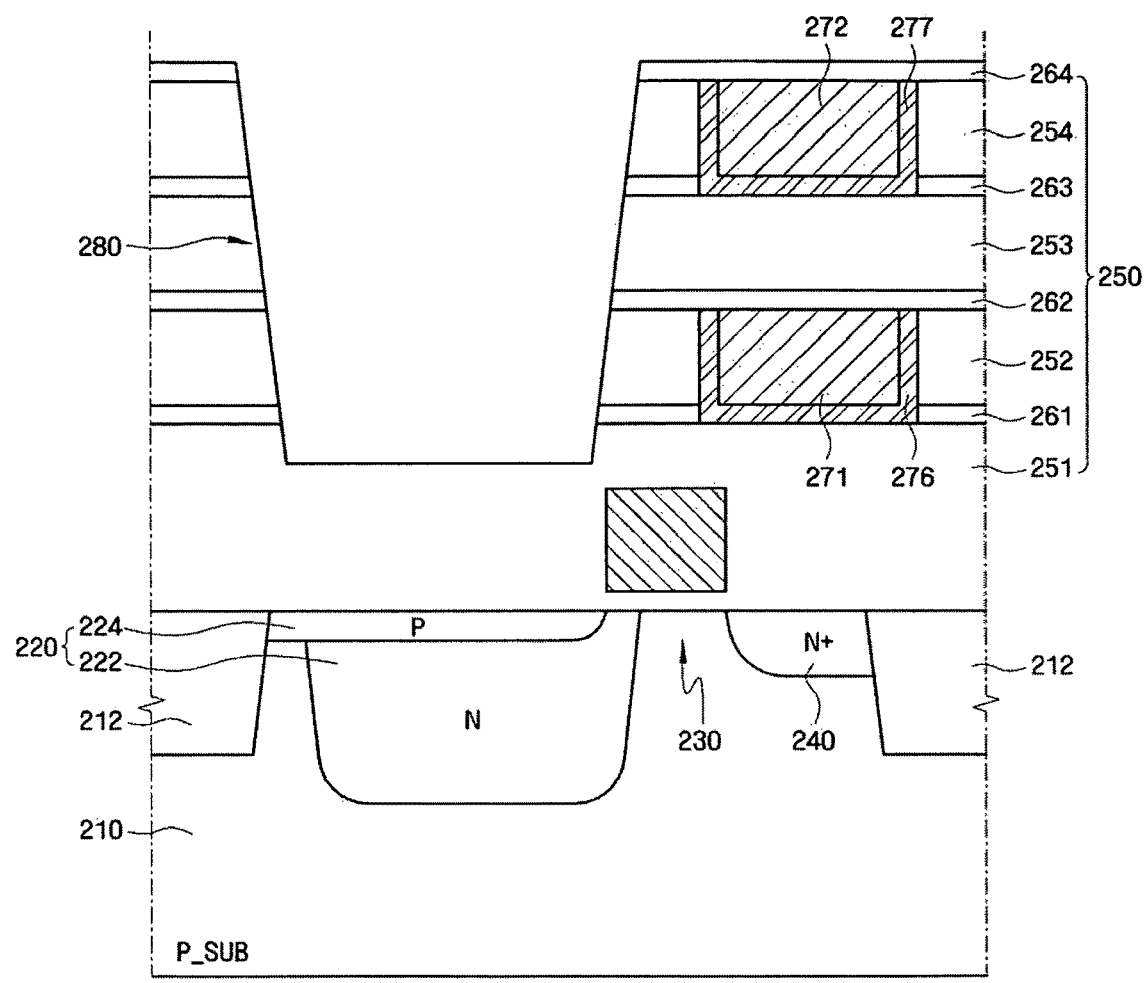

Referring to FIGS. 3 and 4C, on the photoelectric transformation device 220, a cavity 280, which penetrates the multi-layer interlayer dielectric layers 251, 252, 253, 254 and the multi-layer diffusion barrier layers 261, 262, 263, 264, is formed (step S130).

Since the silicon nitride layer used as the diffusion barrier layers 261, 262, 263, 264 has low light penetration characteristics, it can disturb the incident light in reaching the photoelectric transformation device 220. Thus, the cavity 280 is formed to remove the multi-layer interlayer dielectric layers 251, 252, 253, 254 and the multi-layer diffusion barrier layers 261, 262, 263, 264. By forming the cavity 280, the amount of the incident light that reaches the photoelectric transformation device 220 can be increased, and also photo sensitivity can be increased.

As illustrated in FIG. 4C, although the cavity 280 can be formed by removing part of the interlayer dielectric layer 251, other approaches are possible.

Also, as illustrated in FIG. 4C, the cavity 280 can be sloped and have a flat bottom, however, other configurations can be used. For example, the sides of the cavity 280 can have no slope, and the bottom can be in a non-flat shape such as concave or convex.

Such a cavity 280 can be formed, for example, using an etch process.

To form the cavity 280, etching gas including $CF_4$, $CH_2F_2$, CO, and $O_2$, etching gas including $C_5F_8$, $O_2$ and Ar, or etching gas including $CF_4$, $CH_2F_2$, and $O_2$ can be used. A bottom profile of the cavity 280 can be controlled by adjusting relative flow ratio of gas including carbon to $O_2$ gas in the etching gas.

Also, a sidewall of the cavity 280 can be controlled by adding carbon-rich gas such as CO, $CH_2F_2$, $CHF_3$, or $CH_3F$ to the etching gas.

Figure 4D:
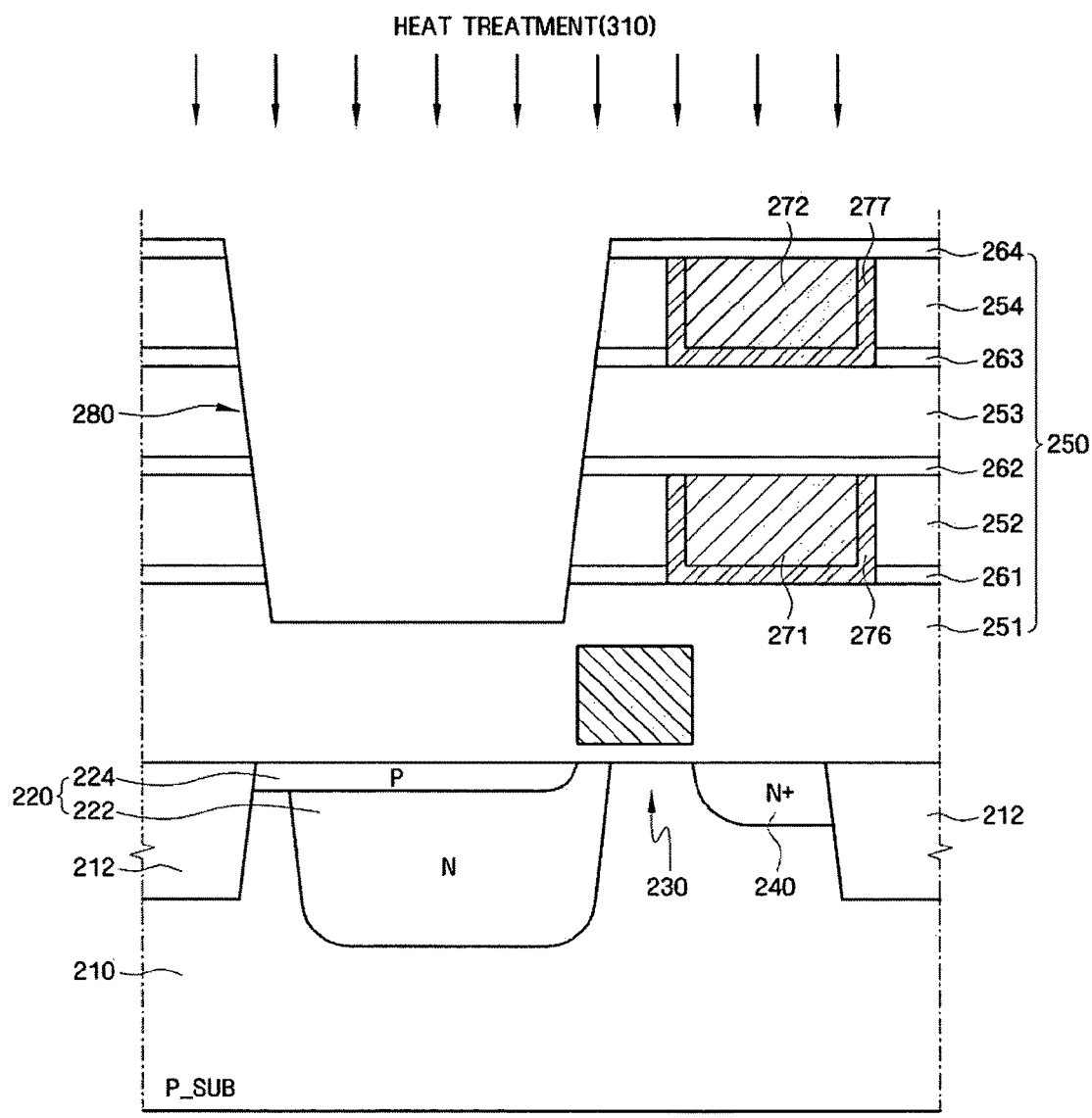

Referring to FIGS. 3 and 4D, heat treatment 310 is performed on the substrate 210 which the cavity 280 is formed (step S140).

When the cavity 280 is formed by a plasma etching process, damage can occur. For example, the stress applied to the photoelectric transformation device 220 can change (hereinafter referred to as a stress issue), charges can be generated on a surface of the photoelectric transformation device 220, on a boundary between the device isolation region 212 and the substrate 210, and on a boundary between the substrate 210 and the charge transmission device 230 (hereinafter referred to as a charging issue.).

Such damage can increase the dark level of output signals. A pixel provides an output signal through an output line Vout, and the output signal can be categorized into a signal level and a dark level. The signal level indicates a voltage value corresponding to charges generated by photoelectric transformation, and the dark level indicates a voltage value corresponding to charges generated by means other than photoelectric transformation (for example, charges generated by heat or other offsets). Therefore, such damage must be repaired.

In the first exemplary embodiment of the present invention, damage can be repaired by performing a heat treatment 310 on the substrate 210 including the cavity 280. Specifically, the heat treatment 310 can resolve the stress issue.

Although the heat treatment 310 can be performed at temperatures between about 200° C. and about 500° C. for about 30 minutes to about 120 minutes, other treatment parameters can be used. Also, the heat treatment 310 can be performed, for example, using furnace equipment; however, other equipment can be used.

Figure 4E:
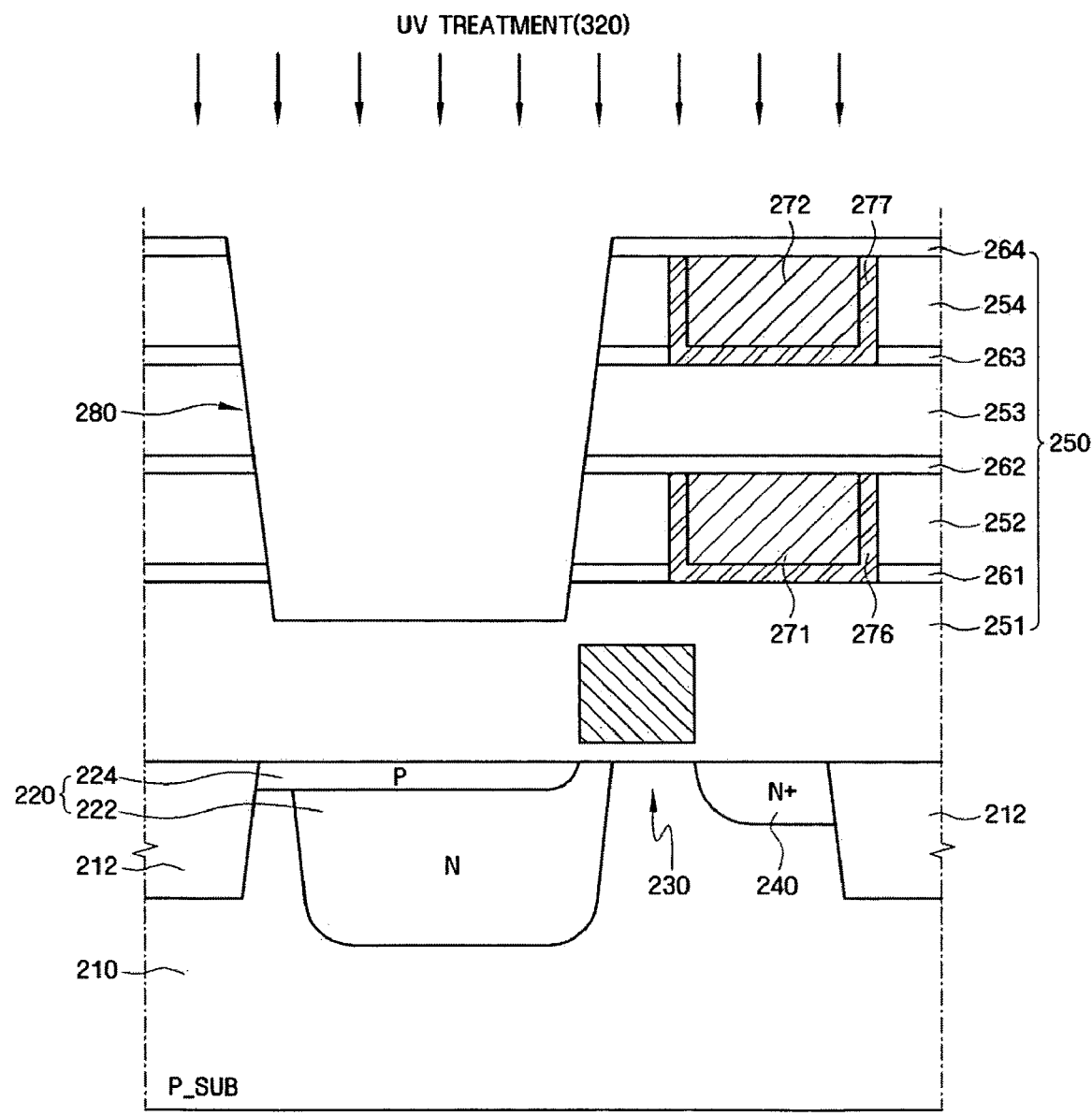

Referring to FIGS. 3 and 4E, a UV treatment 320 is performed on the substrate 210 including the cavity 280 (step S150).

In more detail, damage described earlier can be repaired by performing the UV treatment 320. Specially, the charging issue can be resolved by performing the UV treatment 320. That is, the charges generated on the surface of the photoelectric transformation device 220, the charges generated on the boundary between the device isolation region 212 and substrate 210, and the charges on the boundary between the substrate 210 and charge transmission device 230 can be removed.

Although the UV treatment 320 can be performed at temperatures between about 50° C. and about 200° C. for about 10 seconds to about 300 seconds, other treatment parameters can be used. Also, the UV treatment 320 can be performed using UV bake equipment; however, other equipment can be used.

Figure 4F:
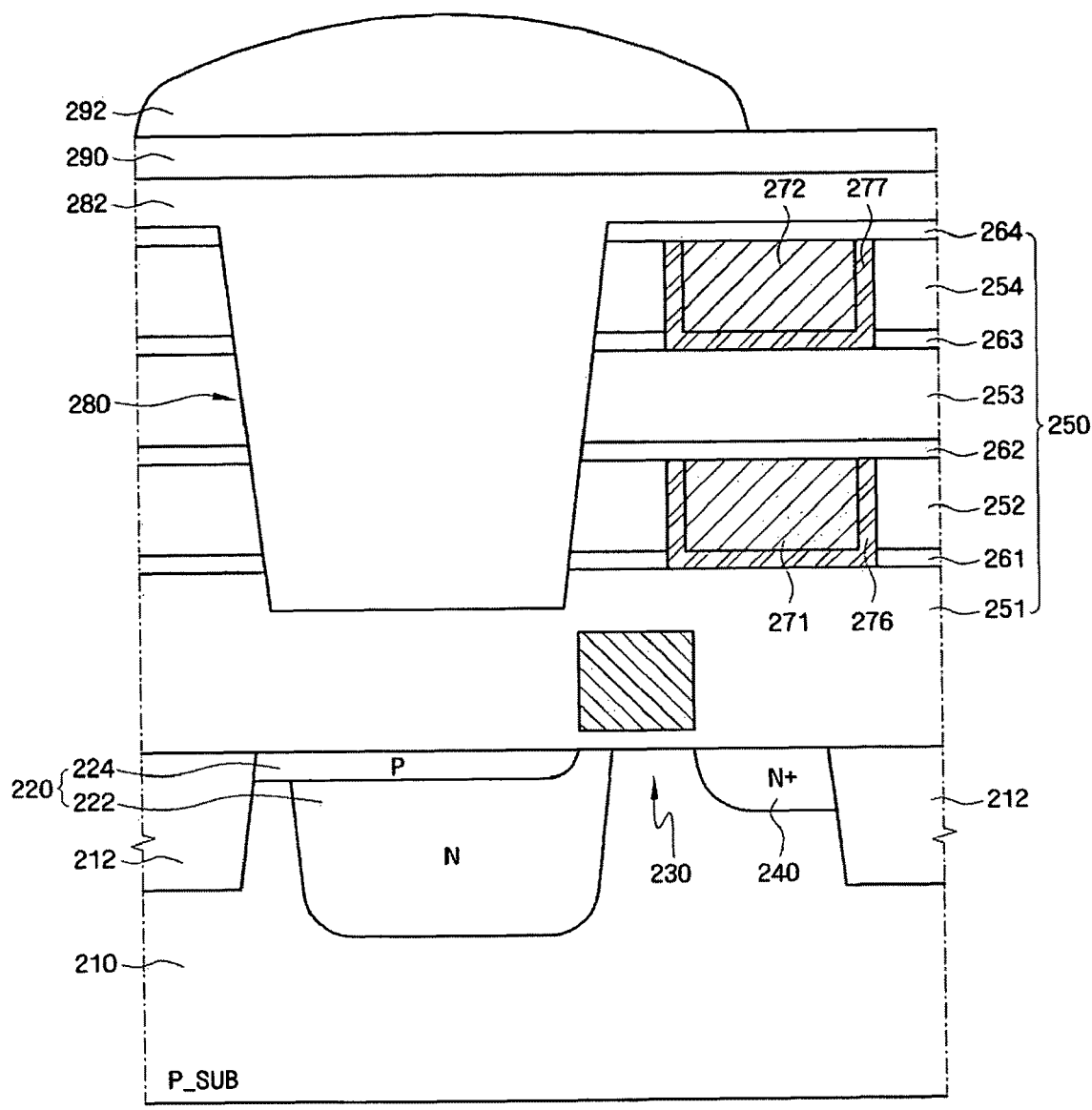

Referring to FIGS. 3 and 4F, the cavity 280 is filled with light penetration material 282 (step S160).

In one embodiment, the light penetration material 282 can be composed of organic high molecular compound such as a fluorine series high molecule having a Cytop™ type ring structure or a high molecule of PMMA series. Other materials can be used. Also, the cavity 280 can be filled with the light penetration material 280 using a spin coating method; however, other methods can be used.

Next, a color filter 290 is formed on the light penetration material 282, and then a microlens 292 is formed on the color filter 290 area corresponding to the area of the photoelectric transformation device 220 (step S170)

In the first exemplary embodiment of the present invention, damage created during the cavity 280 formation can be repaired using the heat treatment 310 and the UV treatment 320. Thus, the dark level of output signals can be reduced.

In the first exemplary embodiment of the present invention, although it is described that the heat treatment 310 is performed followed by the UV treatment, the UV treatment 320 can be performed first followed by the heat treatment.

Figure 5:
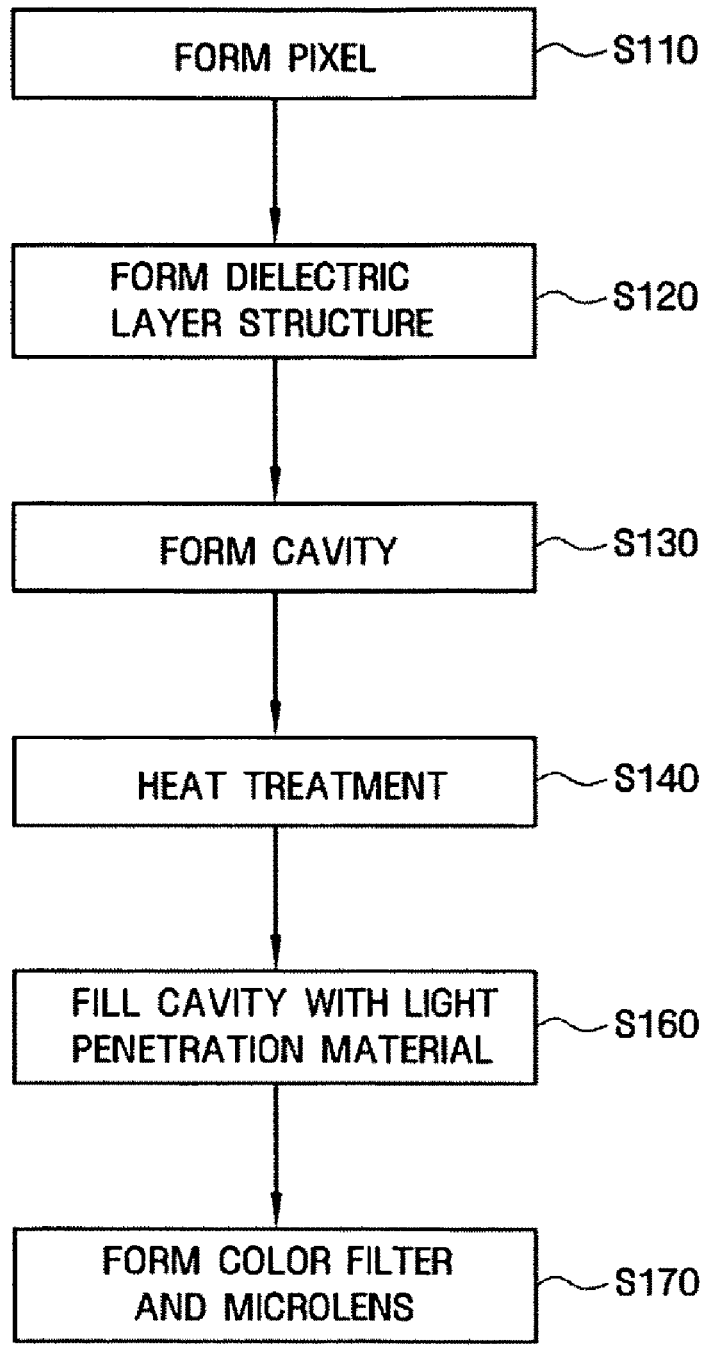
FIG. 5 is a flow chart illustrating a method of fabricating an image sensor according to a second exemplary embodiment of the present invention.

FIG. 5 is a flow chart illustrating a method of fabricating an image sensor according to a second exemplary embodiment of the present invention.

Referring to FIG. 5, the difference between the method of fabricating an image sensor according to the second exemplary embodiment of the present invention and the method of fabricating an image sensor according to the first exemplary embodiment of the present invention is that the former does not perform the UV treatment (step S150) and only performs the heat treatment (step S140) after cavity formation (step S130). The stress issue can be resolved by performing the heat treatment.

Figure 6:
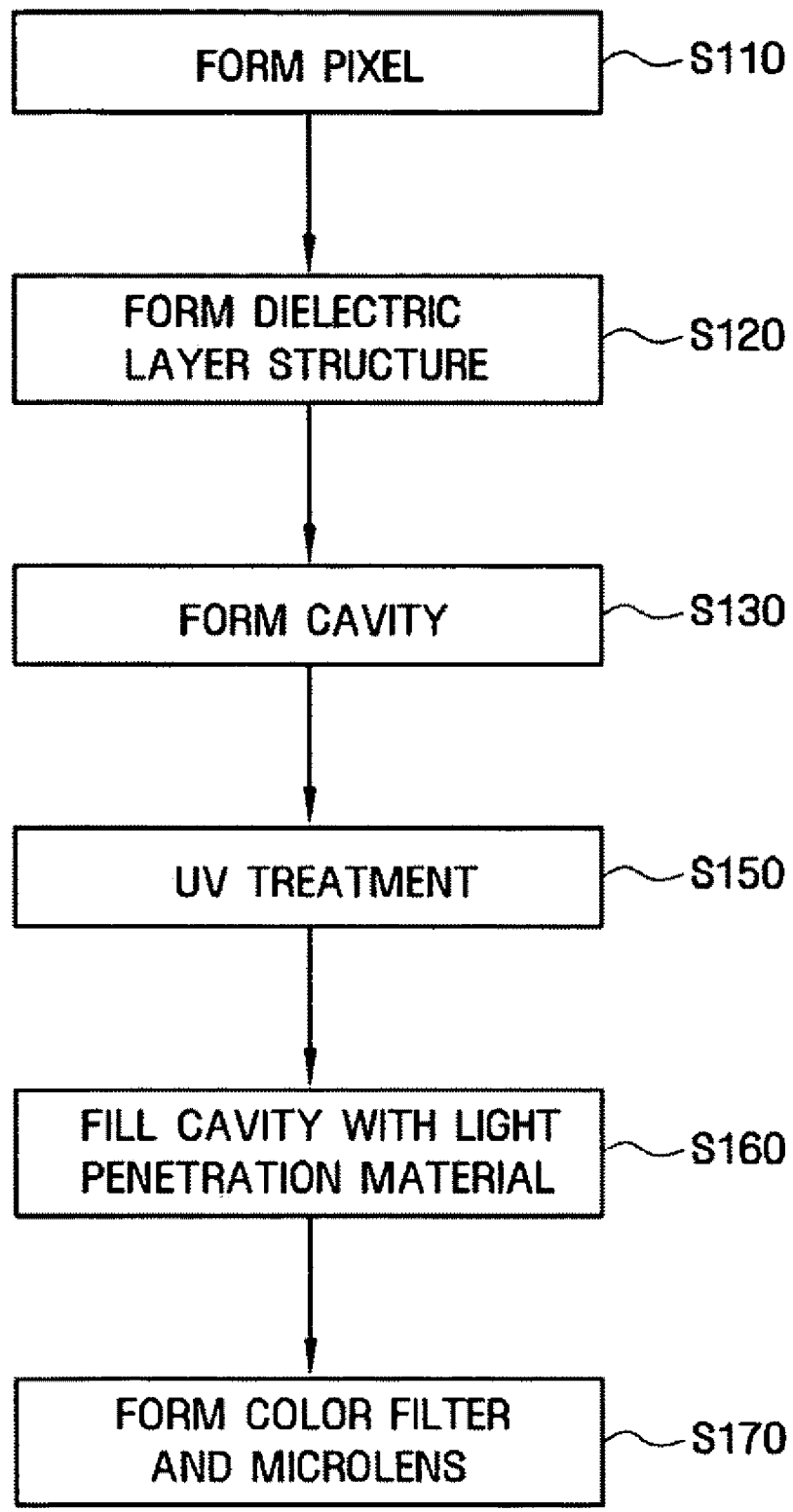
FIG. 6 is a flow chart illustrating a method of fabricating an image sensor according to a third exemplary embodiment of the present invention.

FIG. 6 is a flow chart illustrating a method of fabricating an image sensor according to a third exemplary embodiment of the present invention.

Referring to FIG. 6, the difference between the method of fabricating an image sensor according to the third exemplary embodiment of the present invention and the method of fabricating an image sensor according to the first exemplary embodiment of the present invention is that the former does not perform the heat treatment (step S140) and only performs the UV treatment (step S150) after cavity formation (step S130). By performing the UV treatment, specifically the charging issue can be resolved. The charges generated on a surface of a photoelectric transformation device, the charges generated on a boundary between a device isolation region and a substrate, and charges generated on a boundary between the substrate and the charge transmission device can be removed.

Figure 7:
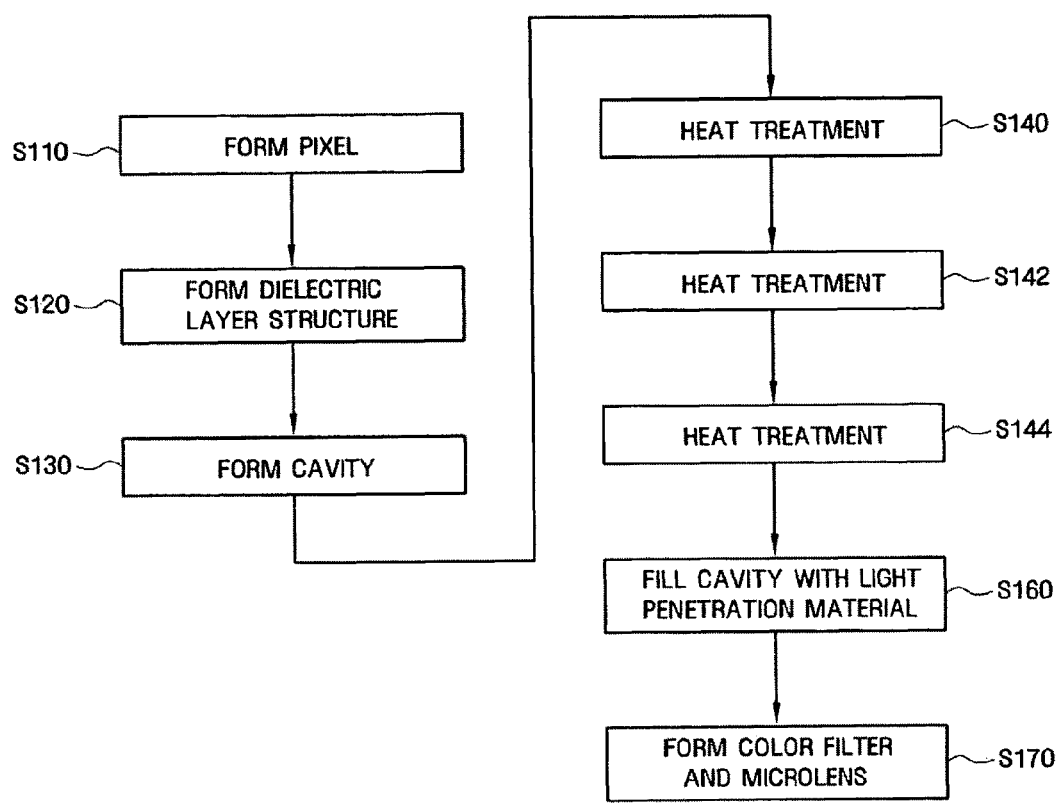
FIG. 7 is a flow chart illustrating a method of fabricating an image sensor according to a fourth exemplary embodiment of the present invention.

FIG. 7 is a flow chart illustrating a method of manufacturing an image sensor according to a fourth exemplary embodiment of the present invention.

Referring to FIG. 7, the difference between the method of fabricating an image sensor according to the fourth exemplary embodiment of the present invention and the method of manufacturing an image sensor according to the second exemplary embodiment of the present invention is that the former performs the heat treatment (steps S140, S142, S144) multiple times after cavity formation (step S130). Although in FIG. 7 the heat treatment is performed three times, it is not limited to this. For example, the heat treatment can be performed four or five times, or any number of times.

The motivation for performing multiple heat treatments is described as follows.

First, if a substrate is exposed to a high temperature for a significant period of time, defects may occur in the substrate. Also, there is a maximum amount of damage that can be repaired during one heat treatment. Thus, even if a heat treatment is performed for an extended period of time, the dark level of output signals only can be reduced to a certain threshold value. Therefore, performing multiple heat treatments increases the amount of damage that can be repaired and reduces the dark level of output signals further.

Multiple heat treatments can be performed at the same treatment temperature for the same period of time. Also, multiple heat treatments can be performed at different treatment temperatures for different periods of time.

Figure 8:
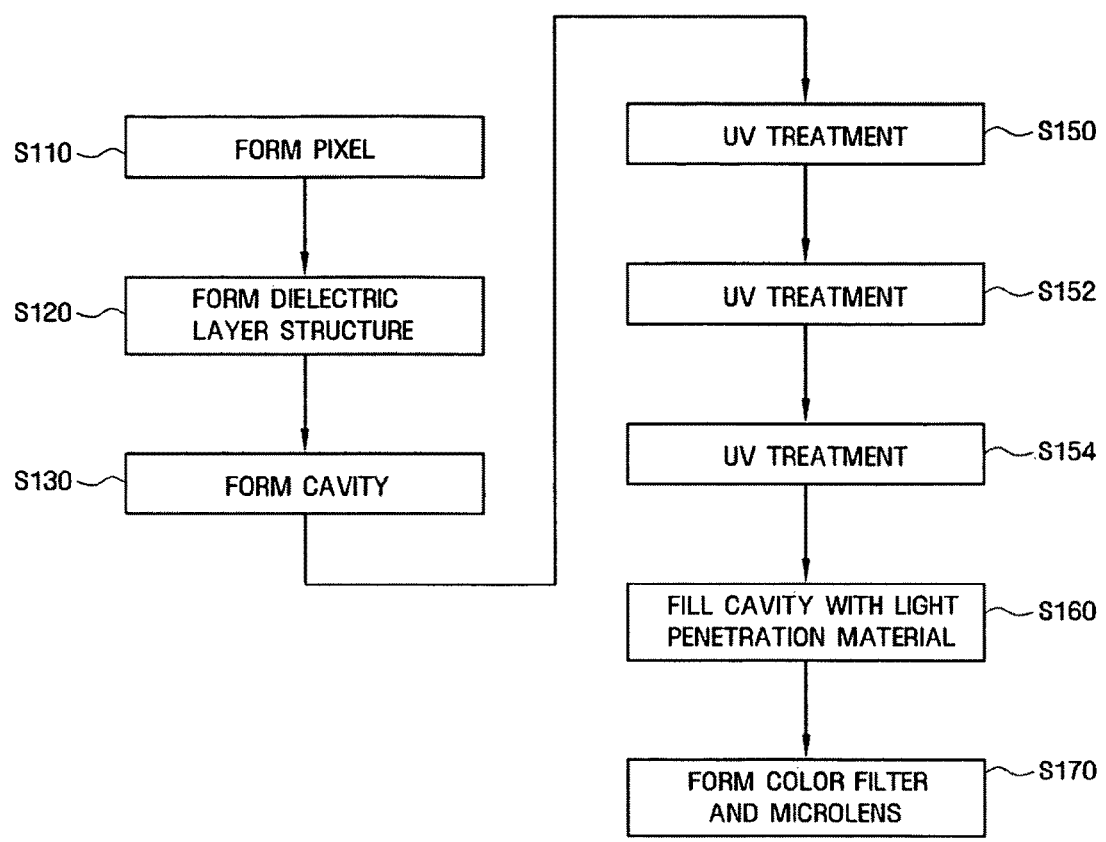
FIG. 8 is a flow chart illustrating a method of fabricating an image sensor according to a fifth exemplary embodiment of the present invention.

FIG. 8 is a flow chart illustrating a method of fabricating an image sensor according to a fifth exemplary embodiment of the present invention.

Referring to FIG. 8, the difference between the method of fabricating an image sensor according to the fifth exemplary embodiment of the present invention and the method of manufacturing an image sensor according to the third exemplary embodiment of the present invention is that the former performs the UV treatment (steps S150, S152, S154) multiple times after cavity formation (step S130). Although in FIG. 8 the UV treatment is performed three times, it is not limited to this. For example, the UV treatment can be performed four or five times, or any number of times.

The motivation for performing multiple UV treatments is described as follows.

There is a maximum amount of damage that can be repaired during one UV treatment. Thus, even if one UV treatment is performed for an extended period of time, the dark level of output signals only can be reduced to a certain threshold value. Therefore, performing multiple UV treatments increases the amount of damage that can be repaired and reduces the dark level of output signals further.

Multiple UV treatments can be performed at the same treatment temperature for the same period of time. Also, multiple UV treatments can be performed at different treatment temperatures for different treatment periods of time.

Also, although it is not illustrated in the drawings, another exemplary embodiment can be understood by combining the five exemplary embodiments described earlier. For example, by combining the first exemplary embodiment, the fourth exemplary embodiment, and the fifth exemplary embodiment, those skilled in the art can perform multiple heat treatments and multiple UV treatments after forming the cavity. Also, those skilled in the art can perform one heat treatment and multiple UV treatments after forming the cavity by combining the second exemplary embodiment and the fifth exemplary embodiment.

More details of the present invention are described through the following experiments, and the content not illustrated in these experiments is not explicitly described since it can be readily understood by those who skilled in this art.

EXPERIMENT EXAMPLES

The reference experiment example involved the measurement of the dark level of output signals without heat treatment or UV treatment after forming the cavity.

Experiment example 1 involved the measurement of the dark level of output signals with heat treatment after forming the cavity.

Experiment example 2 involved the measurement of the dark level of output signals with UV treatment after forming the cavity.

Experiment example 3 involved the measurement of the dark level of output signals with heat treatment followed by UV treatment after forming the cavity.

Figure 9:
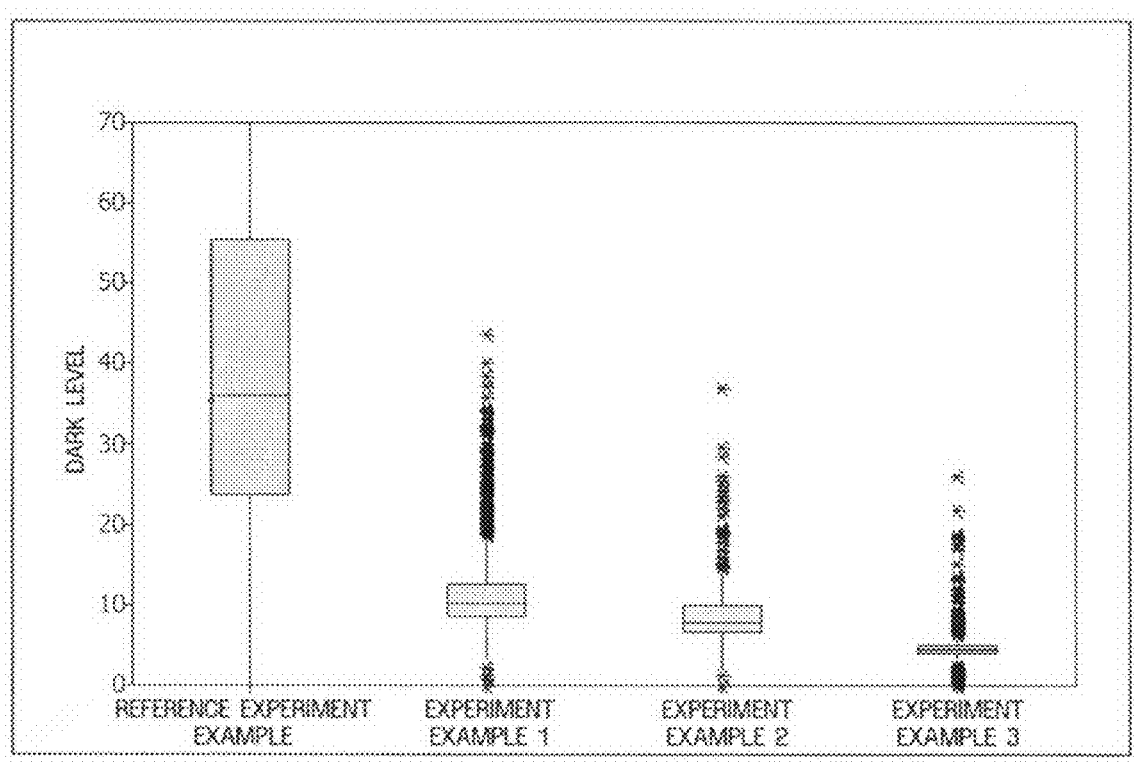
FIG. 9 is a graph illustrating measurement results of a dark level of an output signal after forming a cavity followed by a heat process and UV process.

The measurement results are illustrated in Table 1 and FIG. 9. Table 1 summarizes the medians of the reference experiment and experiments 1 through 3 shown in FIG. 9. FIG. 9 is a box plot and the middle line of the box indicates the median.

Referring to Table 1 and FIG. 9, the median of the reference experiment example was 36.07 mV, and the medians of the experiment examples 1 through 3 were 10.9 mV, 9.8 mV, and 4.93 mV, respectively. As a result, the experiment example 1 shows a 70% improvement over the reference experiment example (∵ 1−10.9/36.07=0.7). Experiment example 2 shows a 72% improvement over the reference experiment example (∵ 1−9.8/36.07=0.72). Experiment example 3 shows a 86% improvement over the reference experiment example (∵ 1−4.93/36.07=0.86).

TABLE 1

| | Reference Experiment Example | Experiment Example 1 | Experiment Example 2 | Experiment Example 3 |
|---|---|---|---|---|
| Dark Level | 36.07 mV | 10.9 mV | 9.8 mV | 4.93 mV |
| Improvement | — | 70% improvement | 72% improvement | 86% improvement |

While the present invention has been particularly shown and described with reference to exemplary embodiments thereof, it will be understood by those of ordinary skill in the art that various changes may be made in the form and details without departing from the spirit and scope of the present invention as defined by the following claims.

What is claimed is:

1. A method of fabricating an image sensor, comprising:
   forming a photoelectric transformation device on a substrate;
   forming a dielectric layer structure on the substrate on which the photoelectric transformation device is formed, wherein the dielectric layer structure includes multi-layer interlayer dielectric layers and multi-layer metal interconnections which are located between the multi-layer interlayer dielectric layers;
   forming a cavity which penetrates the multi-layer interlayer dielectric layers on the photoelectric transformation device; and
   performing a heat treatment on the substrate on which the cavity is formed;
   after the heat treatment, filling the cavity with a light penetration material; and
   performing a UV treatment on the substrate on which the cavity is formed before the cavity is filled with the light penetration material,
   wherein the heat treatment is followed by the UV treatment.

2. The method of claim 1, wherein a process temperature of the heat treatment is higher than a process temperature of the UV treatment, and a process time of the heat treatment is longer than a process time of the UV treatment.

3. The method of claim 1, wherein the heat treatment is performed multiple times.

4. The method of claim 1, further comprising forming a color filter and a microlens on the light penetration material after filling the cavity with the light penetration material.

5. The method of claim 1, wherein the heat treatment is performed at a temperature between about 200° C. and about 500° C. for about 30 minutes to about 120 minutes.

6. The method of claim 1, wherein forming the cavity is performed by a plasma etching process.

7. The method of claim 1, wherein the metal interconnection is a copper interconnection and the dielectric layer structure includes multi-layer diffusion barrier layers to prevent diffusion of the copper interconnection.

8. A method of fabricating an image sensor, comprising:
   forming a photoelectric transformation device on a substrate;
   forming a dielectric layer structure on the substrate on which the photoelectric transformation device is formed, wherein the dielectric layer structure includes multi-layer interlayer dielectric layers and multi-layer metal interconnections which are located between the multi-layer interlayer dielectric layers;
   forming a cavity which penetrates the multi-layer interlayer dielectric layers on the photoelectric transformation device; and performing a UV treatment on the substrate on which the cavity is formed;
after the UV treatment, filling the cavity with a light penetration material; and
performing a heat treatment on the substrate on which the cavity is formed before the cavity is filled with the light penetration material,
wherein the UV treatment is followed by the heat treatment.

9. The method of claim 8, wherein the UV treatment is performed at a temperature between about 50° C. to about 200° C. for about 10 seconds to about 300 seconds.

10. The method of claim 8, wherein the UV treatment is performed multiple times.

11. A method of fabricating an image sensor, comprising:
forming a photoelectric transformation device on a substrate;
forming a dielectric layer structure on the substrate on which the photoelectric transformation device is formed, wherein the dielectric layer structure includes multi-layer interlayer dielectric layers and multi-layer copper interconnections;
forming a cavity, which penetrates the multi-layer interlayer dielectric layers on the photoelectric transformation device, by a plasma etching process;
performing a heat treatment on the substrate on which the cavity is formed;
performing a UV treatment on the substrate on which the heat treatment is performed;
filling the cavity with a light penetration material after the heat treatment and the UV treatment are performed; and
forming a color filter and a microlens on the light penetration material,
wherein a process temperature of the heat treatment is higher than a process temperature of the UV treatment, and a process time of the heat treatment is longer than a process time of the UV treatment.

12. The method of claim 11, wherein the heat treatment is performed multiple times.

13. The method of claim 11, wherein the UV treatment is performed multiple times.

* * * * *